(12) United States Patent
Kim et al.

(10) Patent No.: US 10,128,278 B2
(45) Date of Patent: Nov. 13, 2018

(54) THIN FILM TRANSISTOR SUBSTRATE AND METHOD OF MANUFACTURING THE SAME

(71) Applicant: SAMSUNG DISPLAY CO., LTD., Yongin-si, Gyeonggi-Do (KR)

(72) Inventors: Byoung-Yong Kim, Seoul (KR); Woong-Ki Jeon, Yongin-si (KR); Hyun-Jin Kim, Pohang-si (KR); Jean-Ho Song, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/997,357

(22) Filed: Jan. 15, 2016

(65) Prior Publication Data
US 2016/0260749 A1   Sep. 8, 2016

(30) Foreign Application Priority Data
Mar. 4, 2015  (KR) .................. 10-2015-0030485

(51) Int. Cl.
*H01L 27/12*   (2006.01)
*H01L 21/311*   (2006.01)
(Continued)

(52) U.S. Cl.
CPC .... *H01L 27/1248* (2013.01); *H01L 21/31116* (2013.01); *H01L 27/124* (2013.01);
(Continued)

(58) Field of Classification Search
CPC . H01L 29/4908; H01L 27/12; H01L 27/1248; H01L 21/31116; H01L 27/124;
(Continued)

(56) References Cited

U.S. PATENT DOCUMENTS 7,471,831 B2   12/2008  Bearman et al.
2007/0298554 A1*  12/2007  Long .................. G02F 1/136227
                                                        438/160
(Continued)

FOREIGN PATENT DOCUMENTS

KR   10-2007-0009761 A   1/2007
KR   10-2008-0088375 A   10/2008
KR   10-2012-0124527 A   11/2012

OTHER PUBLICATIONS

Kim et al; Machine Translation; KO 10-2015-0124527.*
(Continued)

*Primary Examiner* — Stephen Bradley
*Assistant Examiner* — Patricia Reddington
(74) *Attorney, Agent, or Firm* — Innovation Counsel LLP

(57) ABSTRACT

A thin film transistor substrate includes a switching element comprising a gate electrode electrically connected to a gate line extending in a first direction, an active pattern overlapping with the gate electrode, a source electrode disposed on the active pattern and electrically connected to a data line extending in a second direction crossing the first direction, and a drain electrode spaced apart from the source electrode. The thin film transistor substrate further includes an organic layer disposed on the switching element, a first electrode disposed on the organic layer, and a second electrode overlapping with the first electrode, and electrically connected to the drain electrode. A thickness of the second electrode is thicker than a thickness of the first electrode.

21 Claims, 17 Drawing Sheets

(51) Int. Cl.
    *H01L 29/786*    (2006.01)
    *H01L 29/66*     (2006.01)

(52) U.S. Cl.
    CPC ...... *H01L 27/127* (2013.01); *H01L 29/66765* (2013.01); *H01L 29/78669* (2013.01)

(58) Field of Classification Search
    CPC ............ H01L 27/127; H01L 29/66765; H01L 29/78669; H01L 29/41733
    USPC .......................................................... 257/72
    See application file for complete search history.

(56) References Cited

U.S. PATENT DOCUMENTS

| | | |
|---|---|---|
| 2014/0077282 A1 | 3/2014 | Xu et al. |
| 2014/0147966 A1 | 5/2014 | Nakagawa et al. |
| 2017/0146838 A1* | 5/2017 | Nakata .................. G02F 1/1368 |

OTHER PUBLICATIONS

Weiner et al, "The Oxford English Dictionary"; 1989; Clarendon Press; V20.*
Noh et al; Machine Translation; KO 10-2007-0009761.*
Fujita et al; Machine Translation; KO 10-2008-0088375.*

* cited by examiner

THIN FILM TRANSISTOR SUBSTRATE AND METHOD OF MANUFACTURING THE SAME

CROSS-REFERENCE TO RELATED APPLICATIONS

This application claims priority under 35 U.S.C. § 119 to Korean Patent Application No. 10-2015-0030485, filed on Mar. 4, 2015 in the Korean Intellectual Property Office KIPO, the disclosure of which is herein incorporated by reference in its entirety.

BACKGROUND

1. Field

Exemplary embodiments of the present disclosure relate to thin film transistor substrate and a method of manufacturing the thin film transistor substrate.

2. Description of the Related Art

Generally, a liquid crystal display (LCD) apparatus includes a display substrate, an upper substrate, and a liquid crystal layer interposed between the display substrate and the upper substrate. A plurality of signal lines and a plurality of thin film transistor are formed on the display substrate.

To display an image on the LCD apparatus, a liquid crystal display panel generally uses a twisted nematic (TN) mode. To ensure a wide viewing angle, the liquid crystal display panel may operate in a different mode such as a plane to line switching (PLS) mode.

A liquid crystal display panel of a PLS mode forms a pixel electrode and a common electrode that is overlapped with the pixel electrode. An electric field applied between the pixel electrode and the common electrode to change the orientation of liquid crystal molecules to represent a gray scale.

A pixel electrode of the liquid crystal display panel of the PLS mode is electrically connected to a drain electrode via a contact hole. In a liquid crystal display panel having a low resolution, an organic layer is not exposed by the contact hole. However, in a liquid crystal display panel having a high resolution, an organic layer may be exposed by the contact hole for increasing an aperture ratio.

When the organic layer is exposed, a surface of the organic layer may be damaged in a process of forming a contact hole. The organic layer may become hydrophilic due to a damage on the surface of the organic layer, and thus $H_2O$ is absorbed to the surface of the organic layer. Resultantly, an active unfilled area (AUA) may be formed.

SUMMARY

Exemplary embodiments of the present disclosure provide a display substrate capable of decreasing resistance and increasing transmissivity and a method of manufacturing the display substrate.

In an exemplary embodiment according to one embodiment, a thin film transistor substrate includes a switching element comprising a gate electrode electrically connected to a gate line extending in a first direction, an active pattern overlapping with the gate electrode, a source electrode disposed on the active pattern and electrically connected to a data line extending in a second direction crossing the first direction, and a drain electrode spaced apart from the source electrode. The thin film transistor substrate further includes an organic layer disposed on the switching element, a first electrode disposed on the organic layer, and a second electrode overlapping with the first electrode, and electrically connected to the drain electrode. A thickness of the second electrode is thicker than a thickness of the first electrode.

In an exemplary embodiment, the thin film transistor substrate may further include a passivation layer disposed between the first electrode and the second electrode to insulate the first electrode and the second electrode.

In an exemplary embodiment, the passivation layer may include a contact hole exposing a portion of the drain electrode and a portion of the organic layer.

In an exemplary embodiment, a surface of the organic layer may have a bumpy structure. An average height of bumps of the surface of the organic layer may be less than 300 Å.

In an exemplary embodiment, the second electrode may include a transparent conductive material.

In an exemplary embodiment, a thickness of the second electrode may be more than 750 Å and less than 1000 Å.

In an exemplary embodiment of a thin film transistor substrate according to one embodiment, the thin film transistor substrate includes a switching element comprising a gate electrode electrically connected to a gate line extending in a first direction, an active pattern overlapping with the gate electrode, a source electrode disposed on the active pattern and electrically connected to a data line extending in a second direction crossing the first direction, and a drain electrode spaced apart from the source electrode. The thin film transistor substrate further includes an organic layer disposed on the switching element, a first electrode disposed on the organic layer, a second electrode overlapping with the first electrode, and electrically connected to the drain electrode, a passivation layer disposed between the first electrode and the second electrode to insulate the first electrode and the second electrode, and comprising a contact hole exposing a portion of the drain electrode and a portion of the organic layer, and a covering pattern disposed in the contact hole to cover an exposed portion of the organic layer.

In an exemplary embodiment, the covering pattern may cover the exposed portion of the organic layer and an exposed portion of the drain electrode.

In an exemplary embodiment, the covering pattern may be disposed on the same layer as the first electrode.

In an exemplary embodiment, the covering pattern may be insulated from the first electrode and electrically connected to the second electrode.

In an exemplary embodiment, the first electrode and the second electrode may include a transparent conductive material.

In an exemplary embodiment, wherein a surface of the organic layer may have a bumpy structure. An average height of bumps of the surface of the organic layer may be less than 300 Å.

In an exemplary embodiment of method of manufacturing a thin film transistor substrate according to one embodiment, the method includes forming a gate metal pattern on a base substrate, the gate metal pattern comprising a gate line extending in a first direction and a gate electrode electrically connected to the gate line, forming an active pattern overlapping with the gate electrode, forming a data metal pattern on the active pattern, the data metal pattern comprising a data line extending in a second direction crossing the first direction, a source electrode electrically connected with the gate line and a drain electrode spaced apart from the source electrode, forming an organic layer on the date metal pattern, forming a first electrode on the organic layer, forming a passivation layer on the first electrode, etching the passivation layer by using a power having more than 7 kW and less than 13 kW to form a contact hole exposing a portion of the drain electrode and a portion of the organic layer and forming a second electrode electrically connected to the drain electrode on the passivation layer.

In an exemplary embodiment, a thickness of the second electrode may be thicker than a thickness of the first electrode.

In an exemplary embodiment, a thickness of the second electrode may be more than 750 Å and less than 1000 Å.

In an exemplary embodiment, forming the first electrode may further include forming a covering pattern disposed on the same layer as the first electrode.

In an exemplary embodiment, the covering pattern may cover an exposed portion of the organic layer.

In an exemplary embodiment, the covering pattern may cover an exposed portion of the organic layer and an exposed portion of the drain electrode.

In an exemplary embodiment, the covering pattern may be insulated from the first electrode and electrically connected to the second electrode.

In an exemplary embodiment, the first electrode, the second electrode and the covering pattern may include a transparent conductive material.

According to the present exemplary embodiment, the passivation layer is formed by a relatively low power dry-etching. Thus, a damage of a surface of the organic layer may be decreased, decreasing a formation of a bumpy structure of a surface of the organic layer. Resultantly, $H_2O$ may not be absorbed to a surface of the organic layer, preventing a formation of an active unfilled area (AUA).

In addition, a thickness of the pixel electrode PE according to one embodiment is more than 750 Å and less than 1000 Å, and thus the pixel electrode PE may cover an exposed portion of the organic layer 130 entirely. In addition, the covering pattern covers an exposed portion of the organic layer.

BRIEF DESCRIPTION OF THE DRAWINGS

The above and other features and advantages of the present disclosure will become more apparent by describing in detailed exemplary embodiments thereof with reference to the accompanying drawings, in which.

DETAILED DESCRIPTION

Hereinafter, the present disclosure will be explained in detail with reference to the accompanying drawings.

Figure 1:
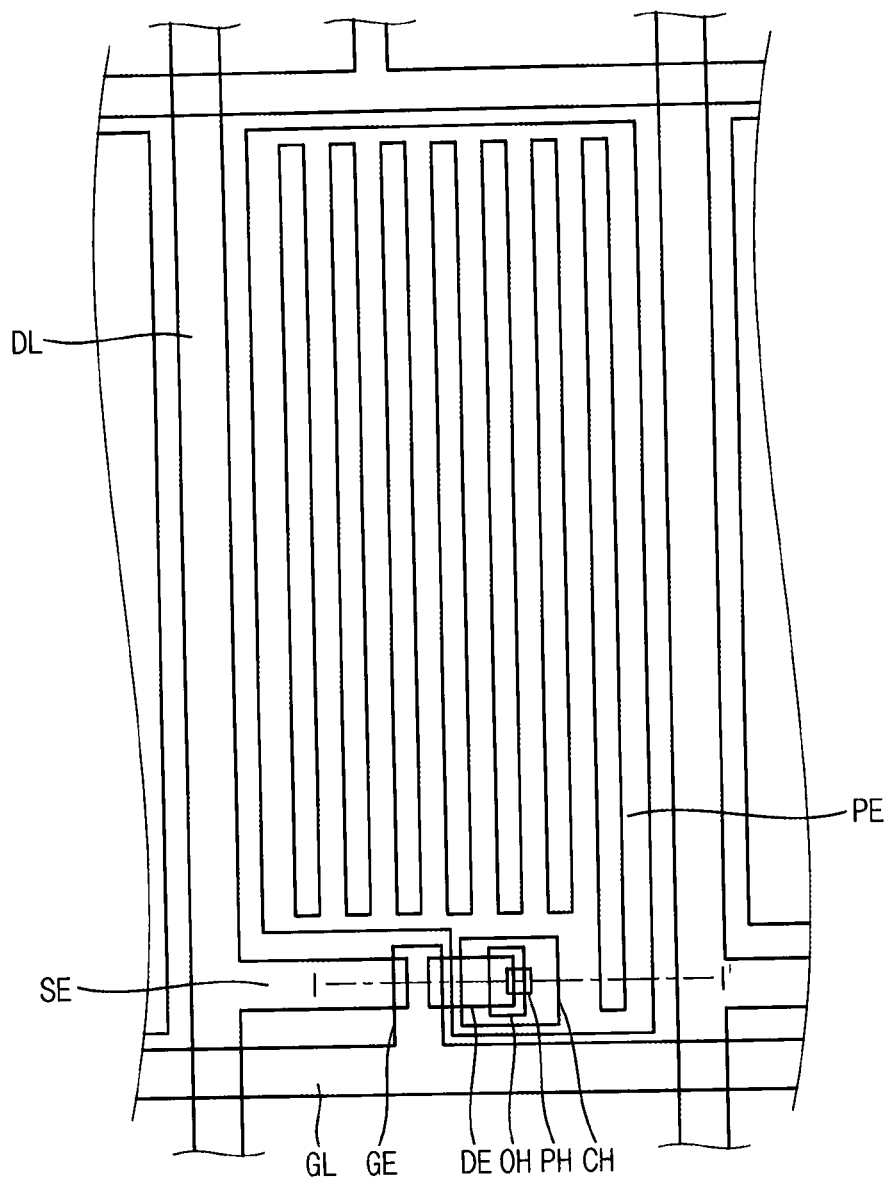
FIG. 1 is a plan view illustrating a thin film transistor substrate according to an exemplary embodiment of the present disclosure.
Figure 1:
Figure 2:
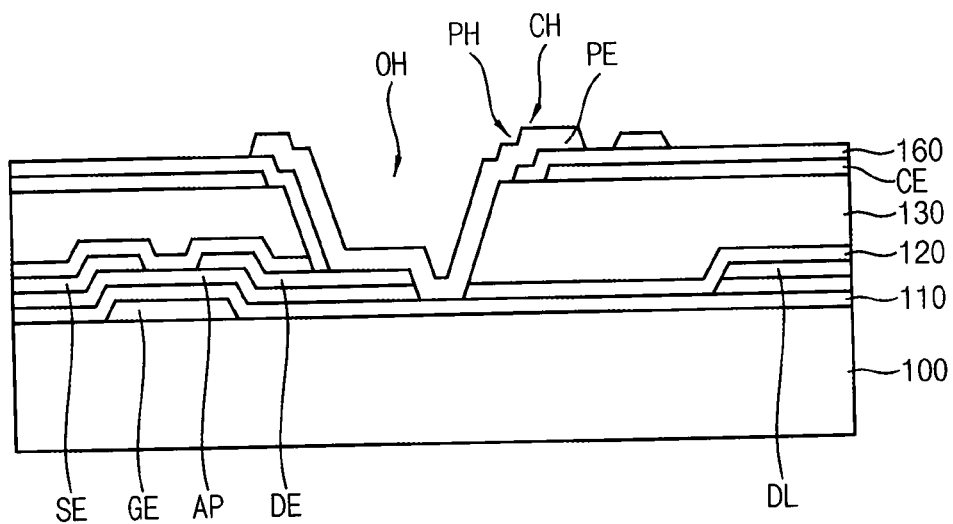
FIG. 2 is a cross-sectional view taken along the line I-I' of FIG. 1.

FIG. 1 is a plan view illustrating a thin film transistor substrate according to an exemplary embodiment of the present disclosure. FIG. 2 is a cross-sectional view taken along the line I-I' of FIG. 1. Referring to FIGS. 1 and 2, a thin film transistor substrate 10 according to an exemplary embodiment includes a base substrate 100, a gate metal pattern including a gate line GL and gate electrode GE, a data metal pattern including a data line DL, a gate insulation 110, an active pattern AP, a first passivation layer 120, an organic layer 130, a common electrode CE, a second passivation layer 160, and pixel electrode PE. The gate line GL extends in a first direction D1. In one embodiment, the gate line GL has a single layer structure including copper (Cu), silver (Ag), chrome (Cr), molybdenum (Mo), aluminum (Al), titanium (Ti), manganese (Mn), and a mixture thereof. In other embodiments, the gate line GL has a multilayer structure having a plurality of layers including materials different each other. For example, the gate line GL may include a copper layer and a titanium layer disposed on and/or under the copper layer. The gate line GL is electrically connected to a gate electrode GE of a switching element. In addition, portions of the gate line GL may form the gate electrode GE.

The gate insulation layer 110 is formed on the gate line GL and the gate electrode GE. The gate insulation layer 110 may include an inorganic material such as silicon oxide (SiOx) and/or silicon nitride (SiNx). In one embodiment, the gate insulation layer 110 includes silicon oxide (SiOx), and may have a thickness of about 500 Å. In another embodiment, the gate insulation layer 110 includes a plurality of layers including different materials from each other.

The active pattern AP is formed on the gate insulation layer 110. According to one embodiment, the active pattern AP includes a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+ a-Si:H).

The data metal pattern may be disposed on the active pattern AP. According to one embodiment, the data metal pattern includes the data line DL, the source electrode SE, and the drain electrode DE. In one embodiment, the data metal pattern has a single layer structure including copper (Cu), silver (Ag), chrome (Cr), molybdenum (Mo), aluminum (Al), titanium (Ti), manganese (Mn), and a mixture thereof. In another embodiment, the data metal pattern has a multilayer structure having a plurality of layers including materials different each other.

The first passivation layer 120 may be formed on the data metal pattern. The first passivation layer 120 may include an inorganic material such as silicon oxide (SiOx) and/or silicon nitride (SiNx). For example, the first passivation layer 120 includes silicon oxide (SiOx), and may have a thickness of about 500 Å. In addition, the first passivation layer 120 may include a plurality of layers including different materials from each other.

The organic layer 130 is disposed on the first passivation layer 120. The organic layer 130 planarizes an upper surface of the thin film transistor substrate 10 to prevent problems that may occur due to a step such as disconnection of a signal line. The organic layer 130 may be an insulation layer including an organic material. For example, the organic layer 130 may a color filter layer having a red color, a green color, a blue color, or a white color.

The common electrode CE may be disposed on the organic layer 130. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE.

The second passivation layer 160 may be formed on the common electrode CE. The second passivation layer 160 may include an inorganic material such as silicon oxide (SiOx) and/or silicon nitride (SiNx). In one embodiment, the second passivation layer 160 includes silicon oxide (SiOx), and may have a thickness of about 500 Å. In another embodiment, the second passivation layer 160 may include a plurality of layers including different materials from each other.

A common electrode hole CH may be formed through the common electrode CE. The common electrode hole CH partially exposes the drain electrode DE and the organic layer 130. An organic hole OH may be formed through the organic layer 130. The organic hole OH partially exposes the drain electrode DE. A passivation hole PH may be formed through the second passivation layer 160. The passivation hole PH partially exposes the drain electrode DE and the organic layer 130.

The passivation hole PH may be formed by dry-etching. In one embodiment, the passivation hole PH may be formed by dry-etching using a power having more than 7 kW and less than 13 kW. Preferably, the passivation hole PH may be formed by dry-etching using a power of 10 kW.

When the second passivation layer 160 is dry-etched, an exposed portion of the organic layer 130 may be damaged. In addition, as a result of damage on a surface of the organic layer 130, the surface of the organic layer 130 may have a bumpy structure. Accordingly, H$_2$O may be absorbed to the damaged surface of the organic layer, forming an active unfilled area (AUA).

However, the second passivation layer 160 according to the present disclosure is formed by dry-etching of a relatively low power, for example, a power of 10 kW. The dry-etching of the second passivation layer 160 using a relatively low power decreases a damage and formation of a bumpy structure on a surface of the organic layer 130. Accordingly, H$_2$O is not absorbed to a surface of the organic layer, thus the formation of an active unfilled area (AUA) may be prevented.

A pixel electrode PE is formed on the second passivation layer 160. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. Accordingly, an electric field applied between the pixel electrode PE and the common electrode CE changes the orientation of liquid crystal molecules to represent a gray scale.

In the present exemplary embodiment, a thickness of the pixel electrode PE may be greater than 750 Å and less than 1000 Å. The pixel electrode PE covers an exposed portion of the organic layer 130. When the second passivation layer 160 is dry-etched, an exposed surface of the organic layer 130 may be damaged forming a bumpy structure. When a thickness of the pixel electrode PE is less than 550 Å, the pixel electrode PE may not cover an exposed surface of the organic layer 130 entirely. Accordingly, H$_2$O may be absorbed to the surface of the organic layer, forming an active unfilled area (AUA).

According to one embodiment, a thickness of the pixel electrode PE is more than 750 Å and less than 1000 Å. The pixel electrode PE covers an exposed portion of the organic layer 130 entirely. Resultantly, H$_2$O may not be absorbed to a surface of the organic layer, preventing a formation of an active unfilled area (AUA).

Figure 3:
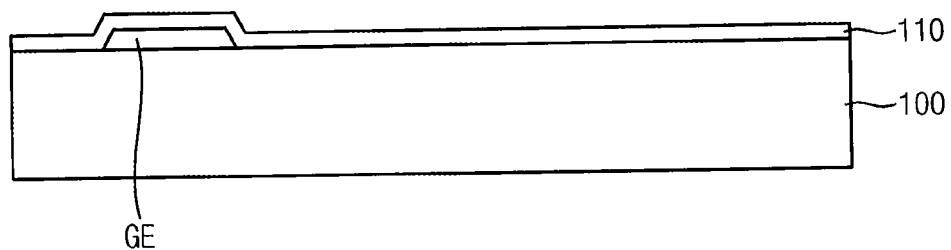
FIGS. 3 to 12 are cross-sectional views illustrating a method of manufacturing the thin film transistor of FIG. 2.

FIGS. 3 to 12 are cross-sectional views illustrating a method of manufacturing the thin film transistor of FIG. 2. Referring to FIG. 3, a gate electrode GE is formed on a base substrate 100. For example, a gate metal layer is formed on the base substrate 100 and patterned to form the gate line GL and the gate electrode GE. The gate metal pattern may include the gate line GL and the gate electrode GE. Examples of the base substrate 100 may include a glass substrate, a quartz substrate, a silicon substrate, a plastic substrate and the like.

Thereafter, a gate insulation layer 110 is formed to cover the gate line GL and the gate electrode GE. The gate insulation layer 110 may include an inorganic insulation material. For example, the gate insulation layer 110 includes silicon oxide (SiOx) or silicon nitride (SiNx). In one embodiment, the gate insulation layer 110 includes silicon oxide (SiOx) and may have thickness of 500 Å. In addition, the gate insulation layer 110 may have a multilayer structure having a plurality of layers including materials different each other.

Figure 4:
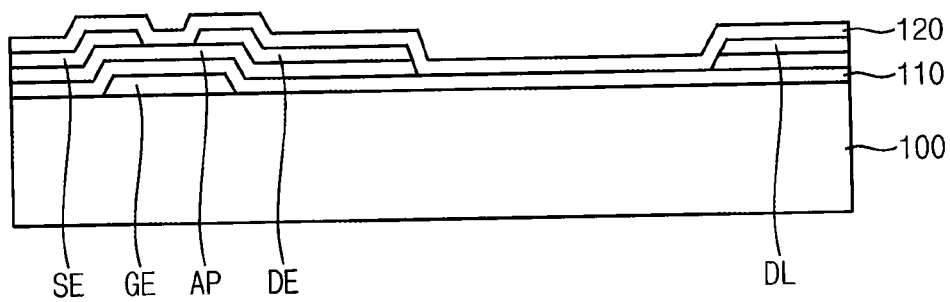

Referring to FIG. 4, an active pattern AP and a data metal pattern is formed on the gate insulation layer 110. The data metal pattern may include a data line DL, a source electrode SE, and a drain electrode DE. Thereafter, a first passivation layer 120 may be formed on the base substrate 100 on which the data metal pattern is formed.

The active pattern AP is formed on the gate insulation layer 110. The active pattern AP may include a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+ a-Si:H).

The data metal pattern may be disposed on the active pattern AP. The data metal pattern may include the data line DL, the source electrode SE and the drain electrode DE. In one embodiment, the data metal pattern has a single layer structure including copper (Cu), silver (Ag), chrome (Cr), molybdenum (Mo), aluminum (Al), titanium (Ti), manganese (Mn), and a mixture thereof. In another embodiment, the data metal pattern has a multilayer structure having a plurality of layers including materials different each other.

The first passivation layer 120 may be formed on the data metal pattern. The first passivation layer 120 may include an inorganic material such as silicon oxide (SiOx) and/or silicon nitride (SiNx). In one embodiment, the first passivation layer 120 includes silicon oxide (SiOx), and may have a thickness of about 500 Å. In another embodiment, the first passivation layer 120 includes a plurality of layers including different materials from each other.

Figure 5:
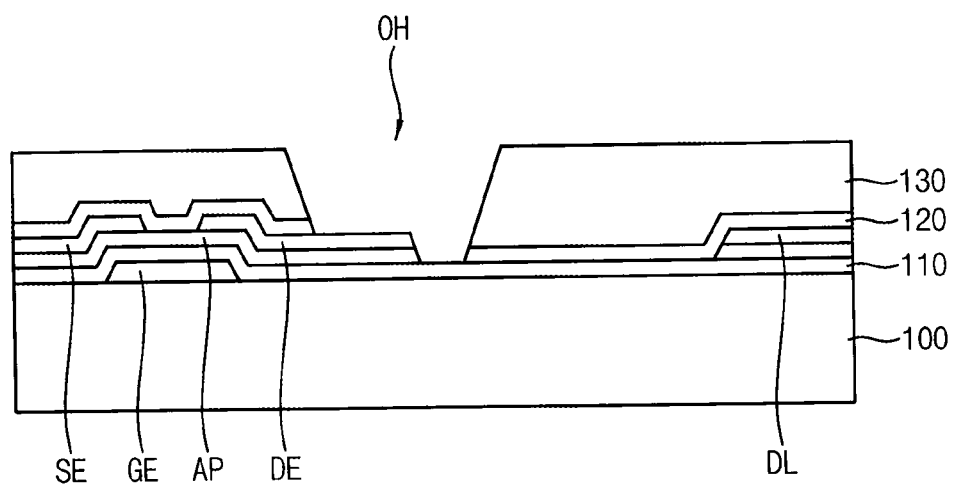

Referring to FIG. 5, an organic layer 130 is formed on the first passivation layer 120. Thereafter, the organic layer 130 is patterned to form an organic hole OH.

The organic layer 130 is disposed on the first passivation layer 120. The organic layer 130 planarizes an upper surface of the thin film transistor 10 to prevent problems that may occur due to a step such as disconnection of a signal line. The organic layer 130 may be an insulation layer including an organic material. For example, the organic layer 130 may a color filter layer having a red color, a green color, a blue color, or a white color. The organic hole OH partially exposes the drain electrode DE.

Figure 6:
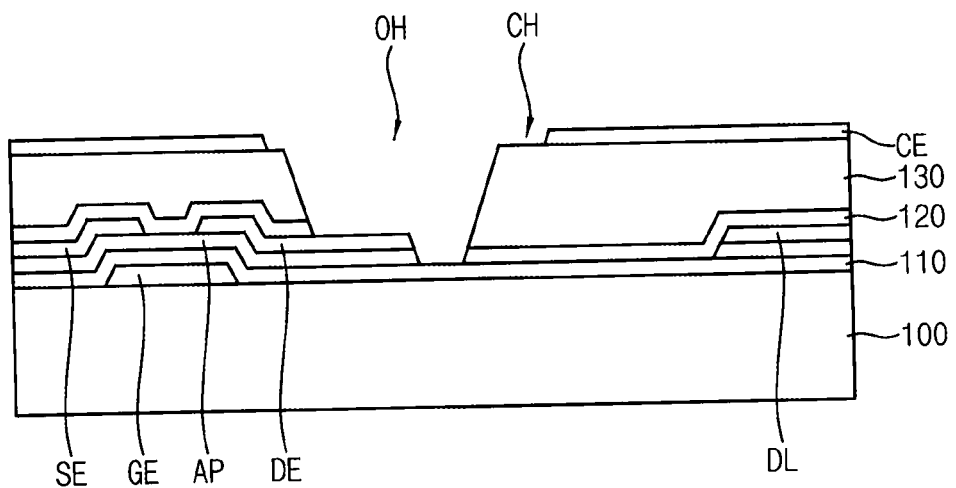

Referring to FIG. 6, a common electrode CE is formed on the base substrate 100 on which the organic hole OH is formed. Thereafter, a common electrode hole CH is formed through the common electrode CE. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE. A thickness of the common electrode CE may be less than 550 Å. The common electrode hole CH partially exposes the drain electrode DE and the organic layer 130.

Figure 7:
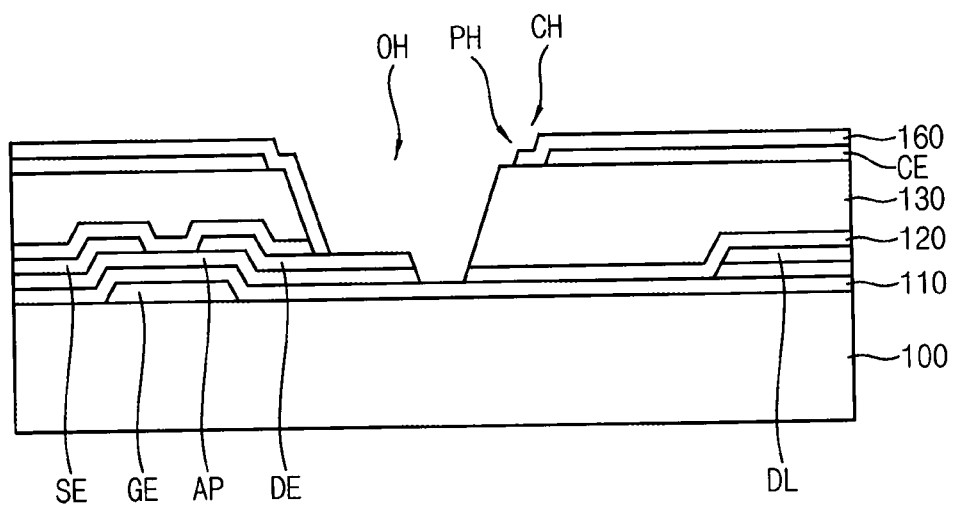

Referring to FIG. 7, a second passivation layer 160 is formed on the base substrate 100 on which the common electrode hole CH is formed. Thereafter, the second passivation layer 160 is patterned to form a passivation hole PH. The second passivation layer 160 may include an inorganic material such as silicon oxide (SiOx) and/or silicon nitride (SiNx). In one embodiment, the second passivation layer 160 includes silicon oxide (SiOx), and may have a thickness of about 500 Å. In another embodiment, the second passivation layer 160 includes a plurality of layers including different materials from each other. The second passivation layer 160 may cover an exposed portion of the drain electrode DE, an exposed portion of the first passivation layer 120, an exposed portion of the organic layer 130, and the common electrode CE.

The passivation hole PH may be formed by dry-etching. In one embodiment, the passivation hole PH is formed by dry-etching using a power having more than 7 kW and less than 13 kW. Preferably, the passivation hole PH may be formed by dry-etching using a power of 10 kW.

When the second passivation layer 160 is dry-etched, an exposed portion of the organic layer 130 may be damaged forming a bumpy structure on the surface of the organic layer 130. Resultantly, $H_2O$ may be absorbed to a surface of the organic layer forming an active unfilled area (AUA).

The second passivation layer 160 according to one embodiment is formed by dry-etching using a relatively lower power, for example, 10 kW. The relatively low powered dry-etching of the second passivation layer 160 decreases a damage on a surface of the organic layer 130 and formation of a bumpy structure on the damaged surface of the organic layer 130. Resultantly, $H_2O$ may not absorbed to the surface of the organic layer, preventing a formation of an active unfilled area (AUA).

Figure 8:
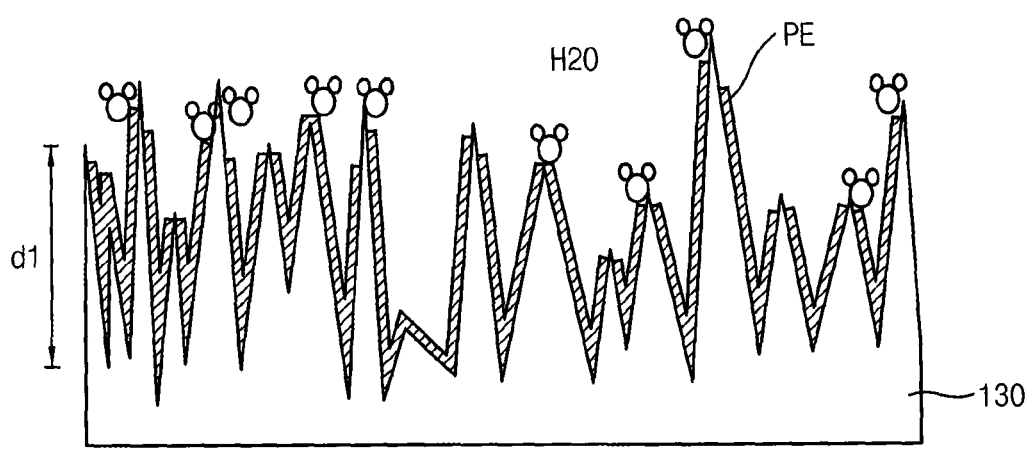

Referring to FIG. 8, a surface of an organic layer 130 is illustrated when a second passivation layer is dry-etched using a relatively high power. When the second passivation layer is dry-etched using a high power, an exposed portion of the organic layer 130 may be damaged. In addition, since a surface of the organic layer 130 is damaged, the surface of the organic layer 130 may have a bumpy structure. For the comparison with a low powered dry-etching, a first height d1, an average height of bumps on the surface of the organic layer 130 after the high powered dry-etching is about 2184 Å. Thereafter, a pixel electrode PE is formed on an exposed portion of the organic layer 130. However, since the surface of the organic layer 130 may have a bumpy structure, the pixel electrode PE may not cover an exposed portion of the organic layer 130 entirely. Accordingly, $H_2O$ may be absorbed to a surface of the organic layer, forming an active unfilled area (AUA).

Figure 9:
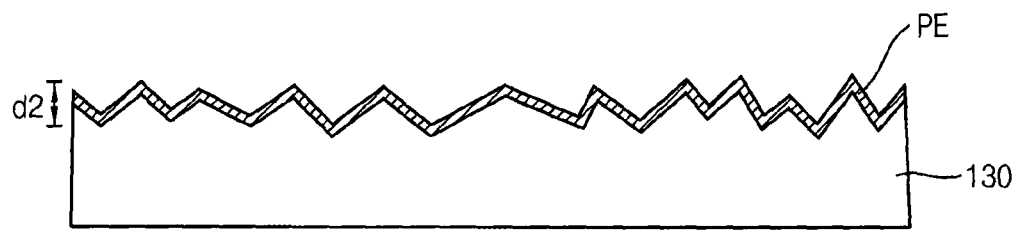

Referring to FIG. 9, a surface of an organic layer 130 is illustrated when a second passivation layer is dry-etched using a relatively low power. When the second passivation layer is dry-etched using a relatively low power, a damage of the exposed portion of the organic layer 130 may be decreased decreasing a formation of a bumpy structure on the surface of the organic layer 130. A second height d2, an average height of bumps on the surface of the organic layer 130 after the low powered dry-etching is less than 300 Å, for example, about 251 Å. According to one embodiment, the second passivation layer 160 is dry-etched by using a power having more than 7 kW and less than 13 kW, preferably, 10 kW.

Figure 10:
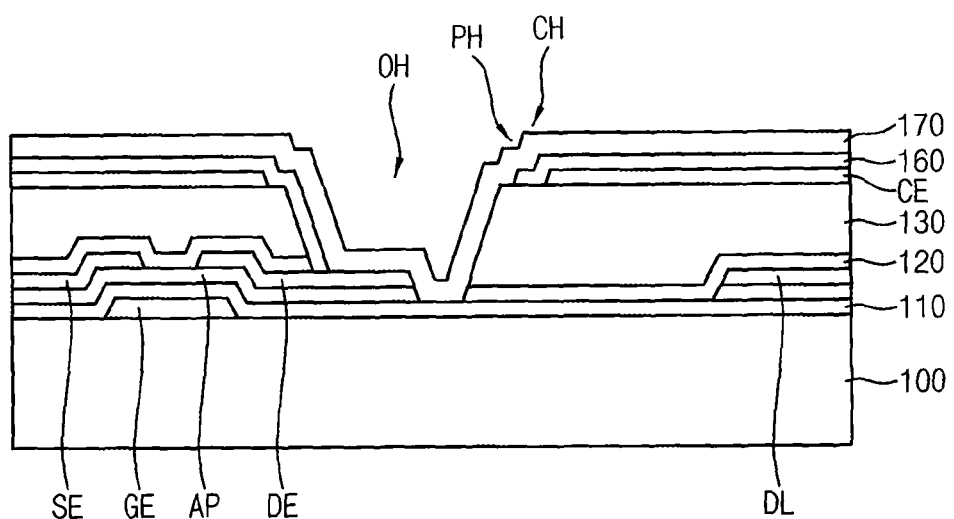

Referring to FIG. 10, a transparent electrode layer 170 is formed on the base substrate 100 on which the passivation hole PH is formed. The transparent electrode layer 170 may include a transparent conductive material, such as indium tin oxide (ITO) and indium zinc oxide (IZO). In addition, transparent electrode layer 170 may include titanium (Ti) and/or molybdenum titanium (MoTi).

In one embodiment, a thickness of the transparent electrode layer 170 is greater than 750 Å and less than 1000 Å. The transparent electrode layer 170 covers an exposed portion of the organic layer 130. When the second passivation layer 160 is dry-etched, an exposed portion of the organic layer 130 may be damaged forming a bumpy structure on the surface of the organic layer 130. When a thickness of the transparent electrode layer 170 is less than 550 Å, the transparent electrode layer 170 may not cover an exposed portion of the organic layer 130 entirely. Resultantly, $H_2O$ may be absorbed to a surface of the organic layer forming an active unfilled area (AUA).

According to one embodiment, a thickness of the transparent electrode layer 170 according to one embodiment is more than 750 Å and less than 1000 Å. The transparent electrode layer 170 may cover an exposed portion of the organic layer 130 entirely. Resultantly, $H_2O$ may not be absorbed to a surface of the organic layer, preventing a formation of an active unfilled area (AUA).

Figure 11:
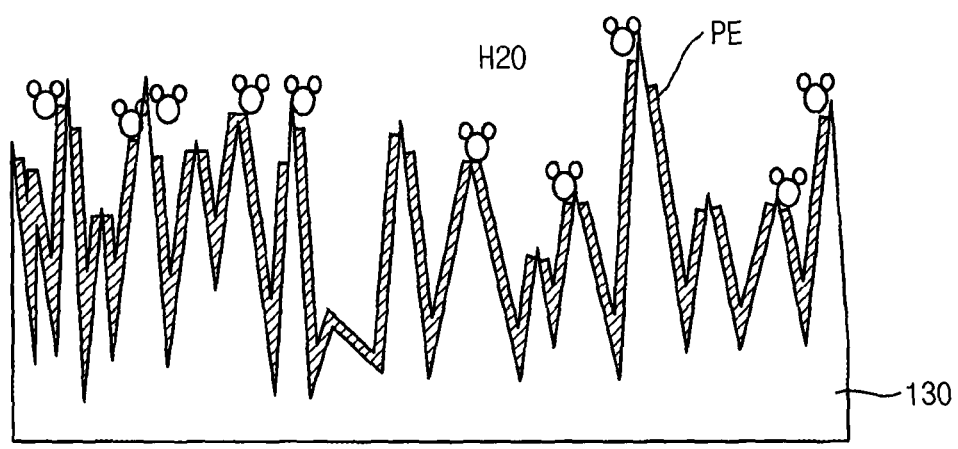

Referring to FIG. 11, a surface of an organic layer 130 is illustrated when a thickness of a pixel electrode PE is less than 550 Å. The pixel electrode PE covers an exposed portion of the organic layer 130. When the second passivation layer is dry-etched, an exposed portion of the organic layer 130 may be damaged forming a bumpy structure on a surface of the organic layer 130. When a thickness of the pixel electrode PE is less than 550 Å, the pixel electrode PE may not cover an exposed portion of the organic layer 130 entirely. Resultantly, $H_2O$ may be absorbed to a surface of the organic layer, forming an active unfilled area (AUA).

Referring to FIG. 11, a surface of an organic layer 130 is illustrated when a thickness of a pixel electrode PE is more than 750 Å and less than 1000 Å. When a thickness of the pixel electrode PE according to one embodiment is more than 750 Å and less than 1000 Å, the pixel electrode PE may cover an exposed portion of the organic layer 130 entirely. Resultantly, $H_2O$ may not be absorbed to a surface of the organic layer, preventing a formation of an active unfilled area (AUA).

Figure 12:
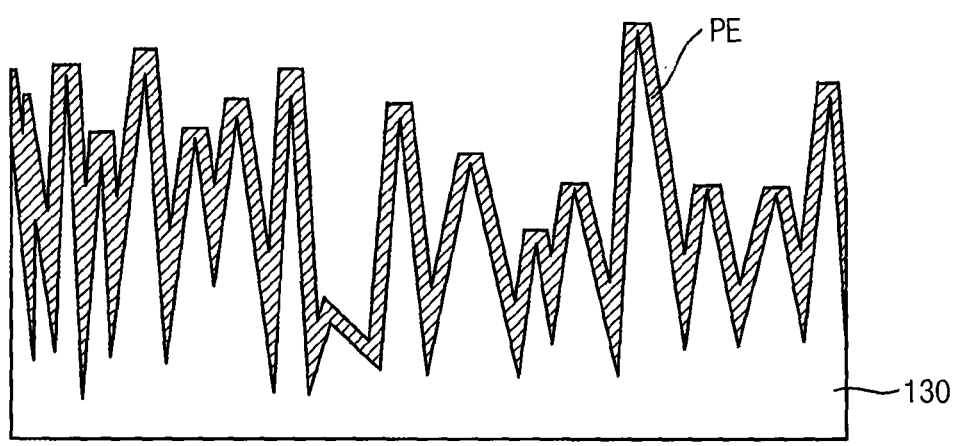

Referring to FIG. 12, the transparent electrode layer 170 is patterned to form a pixel electrode PE. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. An electric field applied between the pixel electrode PE and the common electrode CE changes the orientation of liquid crystal molecules to represent a gray scale.

Figure 13:
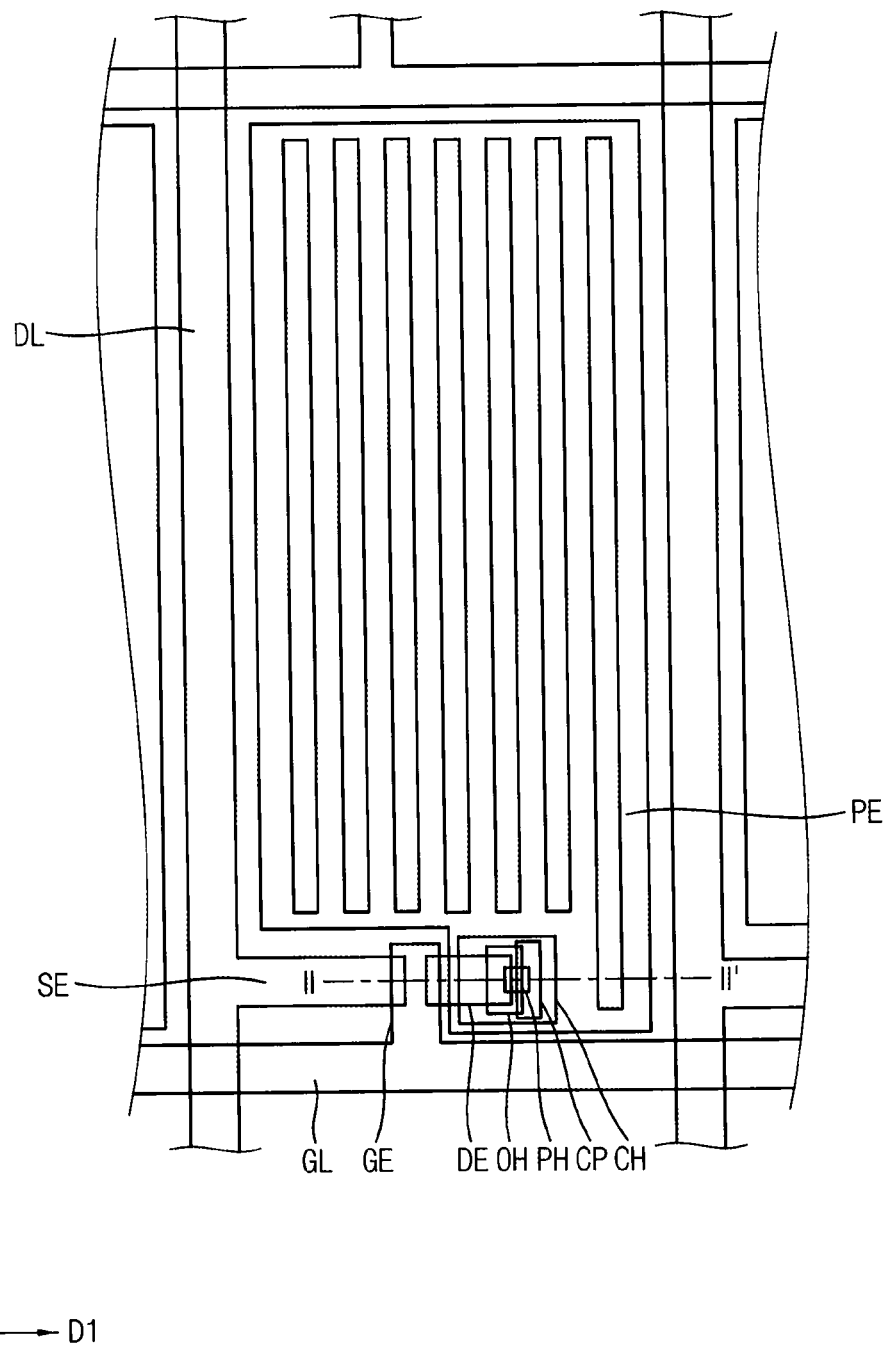
FIG. 13 is a plan view illustrating a thin film transistor substrate according to an exemplary embodiment of the present disclosure.
Figure 14:
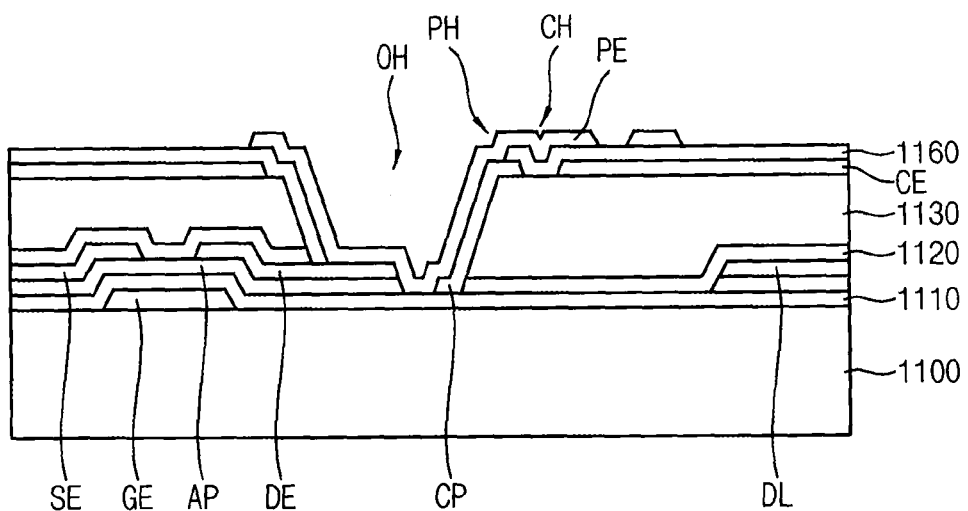
FIG. 14 is a cross-sectional view taken along the line II-II' of FIG. 13.

FIG. 13 is a plan view illustrating a thin film transistor substrate according to an exemplary embodiment. FIG. 14 is a cross-sectional view taken along the line II-II' of FIG. 13. Referring to FIGS. 13 and 14, a thin film transistor substrate 20 according to an exemplary embodiment includes a base substrate 1100, a gate metal pattern including a gate line GL and gate electrode GE, a data metal pattern including a data line DL, a gate insulation 1110, an active pattern AP, a first passivation layer 1120, an organic layer 1130, a common electrode CE, a second passivation layer 1160 and pixel electrode PE.

The gate line GL extends in a first direction D1. In one embodiment, the gate line GL has a single layer structure including copper (Cu), silver (Ag), chrome (Cr), molybdenum (Mo), aluminum (Al), titanium (Ti), manganese (Mn) and a mixture thereof. In another embodiment, the gate line GL has a multilayer structure having a plurality of layers including materials different each other. For example, the gate line GL may include a copper layer and a titanium layer disposed on and/or under the copper layer. The gate line GL is electrically connected to a gate electrode GE of a switching element. In addition, portions of the gate line GL may form the gate electrode GE.

The gate insulation layer 1110 is formed on the gate line GL and the gate electrode GE. The gate insulation layer 1110 may include an inorganic material such as silicon oxide (SiOx) and/or silicon nitride (SiNx). In one embodiment, the gate insulation layer 1110 includes silicon oxide (SiOx), and may have a thickness of about 500 Å. In another embodiment, the gate insulation layer 110 includes a plurality of layers including different materials from each other.

The active pattern AP is formed on the gate insulation layer 1110. According to one embodiment, the active pattern AP includes a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+ a-Si:H).

The data metal pattern may be disposed on the active pattern AP. According to one embodiment, the data metal pattern includes the data line DL, the source electrode SE and the drain electrode DE. In one embodiment, the data metal pattern has a single layer structure including copper (Cu), silver (Ag), chrome (Cr), molybdenum (Mo), aluminum (Al), titanium (Ti), manganese (Mn) and a mixture thereof. In another embodiment, the data metal pattern has a multilayer structure having a plurality of layers including materials different each other.

The first passivation layer 1120 may be formed on the data metal pattern. The first passivation layer 1120 may include an inorganic material such as silicon oxide (SiOx) and/or silicon nitride (SiNx). For example, the first passivation layer 1120 includes silicon oxide (SiOx), and may have a thickness of about 500 Å. In addition, the first passivation layer 1120 may include a plurality of layers including different materials from each other.

The organic layer 1130 is disposed on the first passivation layer 1120. The organic layer 1130 planarizes an upper surface of the thin film transistor substrate 20 to prevent problems that may occur due to a step such as disconnection of a signal line. The organic layer 1130 may be an insulation layer including an organic material. For example, the organic layer 1130 may a color filter layer having a red color, a green color, a blue color or a white color.

The common electrode CE may be disposed on the organic layer 1130. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE.

A covering pattern CP is disposed on the organic layer 1130. The covering pattern CP covers an exposed surface of the organic layer 1130. The covering pattern CP may be disposed on the same layer as the common electrode CE. The covering pattern CP may include a transparent conductive material, such as indium tin oxide (ITO) and indium zinc oxide (IZO). In addition, the covering pattern CP may include titanium (Ti) and/or molybdenum titanium (MoTi).

The second passivation layer 1160 may be formed on the common electrode CE. The second passivation layer 1160 may include an inorganic material such as silicon oxide (SiOx) and/or silicon nitride (SiNx). In one embodiment, the second passivation layer 1160 includes silicon oxide (SiOx), and may have a thickness of about 500 Å. In another embodiment, the second passivation layer 1160 includes a plurality of layers including different materials from each other.

A common electrode hole CH may be formed through the common electrode CE. The common electrode hole CH partially exposes the drain electrode DE and the organic layer 1130. An organic hole OH may be formed through the organic layer 1130. The organic hole OH partially exposes the drain electrode DE. A passivation hole PH may be formed through the second passivation layer 1160. The passivation hole PH partially exposes the drain electrode DE and the organic layer 1130.

The covering pattern CP does not cover the drain electrode DE. The covering pattern CP is insulated from the common electrode CE and is electrically connected to the pixel electrode PE. The covering pattern CP is disposed in the common electrode hole CH to be overlapped with a portion of the organic hole OH and a portion of the passivation hole PH.

The covering pattern CP covers an exposed surface of the organic layer 1130. Resultantly, $H_2O$ may not be absorbed to a surface of the organic layer 1130, preventing a formation of an active unfilled area (AUA).

The passivation hole PH may be formed by dry-etching. In one embodiment, the passivation hole PH may be formed by dry-etching using a power having more than 7 kW and less than 13 kW. Preferably, the passivation hole PH may be formed by dry-etching using a power of 10 kW.

When the second passivation layer 1160 is dry-etched, an exposed portion of the organic layer 1130 may be damaged. However, the covering pattern CP covers an exposed surface of the organic layer 1130, preventing a damage to a surface of the organic layer 1130. Resultantly, $H_2O$ may not be absorbed to a surface of the organic layer, preventing a formation of an active unfilled area (AUA).

A pixel electrode PE is formed on the second passivation layer 1160. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. Accordingly, an electric field applied between the pixel electrode PE and the common electrode CE changes the orientation of liquid crystal molecules to represent a gray scale.

Figure 15:
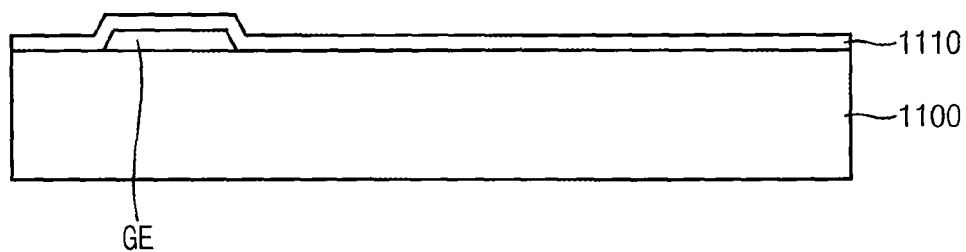
FIGS. 15 to 20 are cross-sectional views illustrating a method of manufacturing the thin film transistor of FIG. 14.

FIGS. 15 to 20 are cross-sectional views illustrating a method of manufacturing the thin film transistor of FIG. 14. Referring to FIG. 15, a gate electrode GE is formed on a base substrate 1100. For example, a gate metal layer is formed on the base substrate 1100, and patterned to form the gate line GL and the gate electrode GE. The gate metal pattern may include the gate line GL and the gate electrode. Examples of the base substrate 1100 may include a glass substrate, a quartz substrate, a silicon substrate, a plastic substrate and the like.

Thereafter, a gate insulation layer 1110 is formed to cover the gate line GL and the gate electrode GE. The gate insulation layer 1110 may include an inorganic insulation material. For example, the gate insulation layer 1110 includes silicon oxide (SiOx) or silicon nitride (SiNx). In one embodiment, the gate insulation layer 1110 includes silicon oxide (SiOx) and may have thickness of 500 Å. In another embodiment, the gate insulation layer 1110 has a multilayer structure having a plurality of layers including materials different each other.

Figure 16:
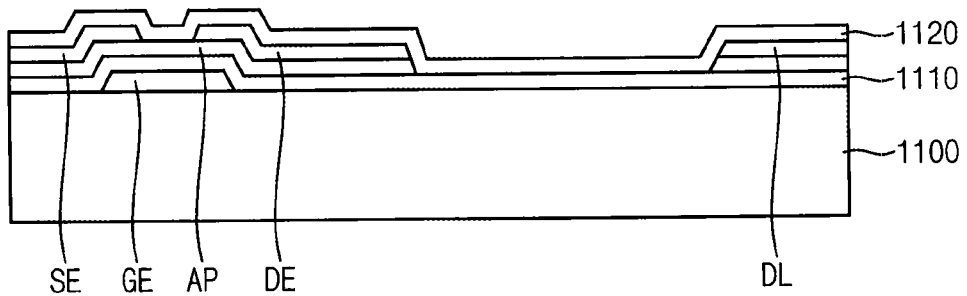

Referring to FIG. 16, an active pattern AP and a data metal pattern is formed on the gate insulation layer 1110. The data metal pattern may include a data line DL, a source electrode SE and a drain electrode DE. Thereafter, a first passivation layer 1120 may be formed on the base substrate 1100 on which the data metal pattern is formed.

The active pattern AP is formed on the gate insulation layer 1110. The active pattern AP may include a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+ a-Si:H).

The data metal pattern may be disposed on the active pattern AP. The data metal pattern may include the data line DL, the source electrode SE and the drain electrode DE. In one embodiment, the data metal pattern has a single layer structure including copper (Cu), silver (Ag), chrome (Cr), molybdenum (Mo), aluminum (Al), titanium (Ti), manganese (Mn) and a mixture thereof. In another embodiment, the data metal pattern has a multilayer structure having a plurality of layers including materials different each other.

The first passivation layer 1120 may be formed on the data metal pattern. The first passivation layer 1120 may include an inorganic material such as silicon oxide (SiOx) and/or silicon nitride (SiNx). In one embodiment, the first passivation layer 1120 includes silicon oxide (SiOx), and may have a thickness of about 500 Å. In another embodiment, the first passivation layer 1120 includes a plurality of layers including different materials from each other.

Figure 17:
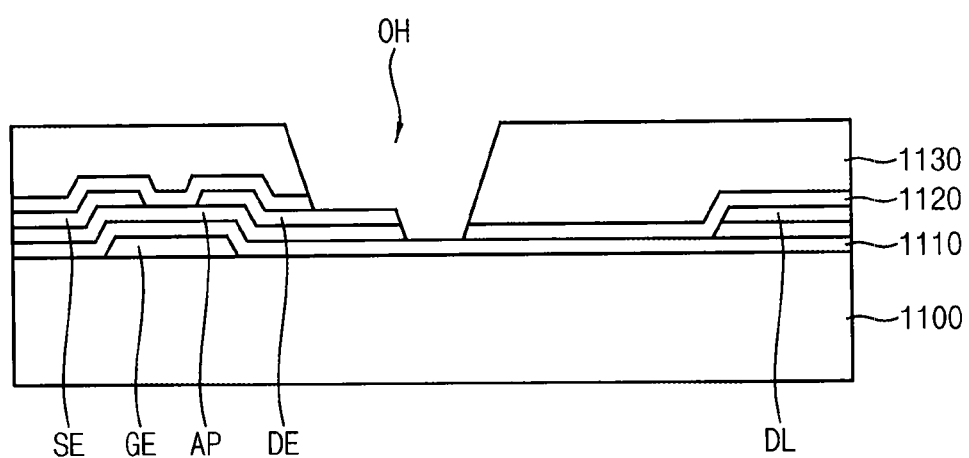

Referring to FIG. 17, an organic layer 1130 is formed on the first passivation layer 1120. Thereafter, the organic layer 1130 is patterned to form an organic hole OH. The organic layer 1130 is disposed on the first passivation layer 1120. The organic layer 1130 planarizes an upper surface of the thin film transistor 20 to prevent problems that may occur due to a step such as disconnection of a signal line. The organic layer 1130 may be an insulation layer including an organic material. For example, the organic layer 1130 may a color filter layer having a red color, a green color, a blue color or a white color. The organic hole OH partially exposes the drain electrode DE.

Figure 18:
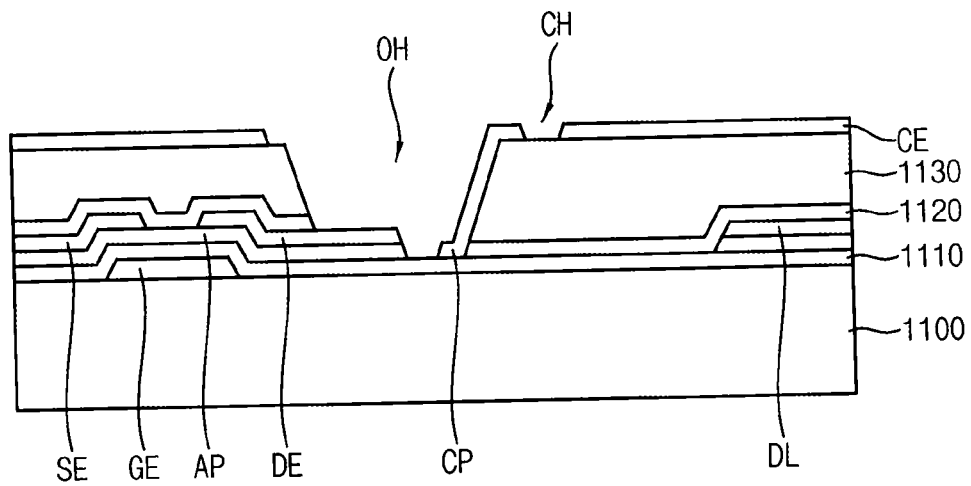

Referring to FIG. 18, a common electrode CE and a covering pattern CP are formed on the base substrate 1100 on which the organic hole OH is formed. The common electrode CE includes a common electrode hole CH. The common electrode hole CH is formed through the common electrode CE. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE. A thickness of the common electrode CE may be less than 550 Å. The common electrode hole CH partially exposes the drain electrode DE and the organic layer 1130.

The covering pattern CP is disposed on the organic layer 1130 and covers an exposed portion of the organic layer 1130. The covering pattern CP may be disposed on the same layer as the common electrode CE. The covering pattern CP may include a transparent conductive material, such as indium tin oxide (ITO) and indium zinc oxide (IZO). In addition, the covering pattern CP may include titanium (Ti) and/or molybdenum titanium (MoTi).

The covering pattern CP does not cover the drain electrode DE. The covering pattern CP is insulated from the common electrode CE and is electrically connected to the pixel electrode PE. The covering pattern CP is disposed in the common electrode hole CH to be overlapped with a portion of the organic hole OH. The covering pattern CP covers an exposed portion of the organic layer 1130. Resultantly, H$_2$O is not absorbed to a surface of the organic layer, preventing a formation of an active unfilled area (AUA).

Figure 19:
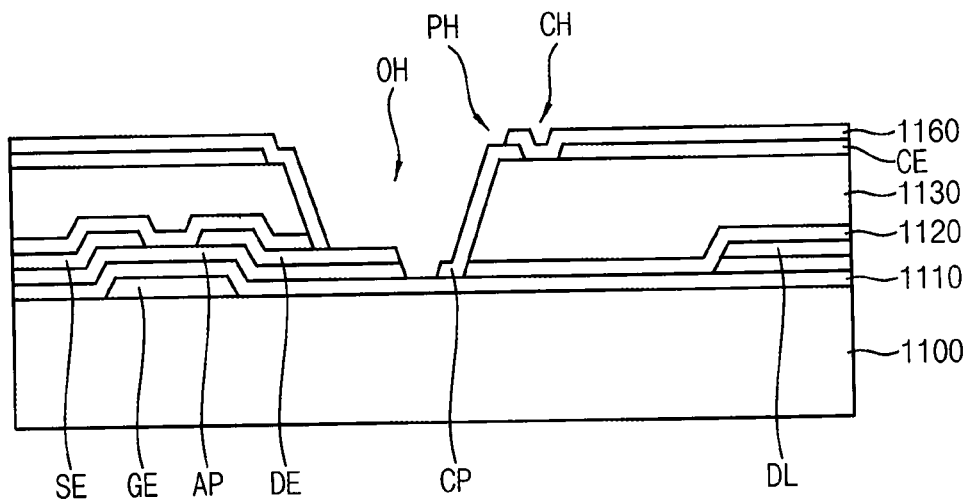

Referring to FIG. 19, a second passivation layer 1160 is formed on the base substrate 1100 on which the common electrode hole CH is formed. Thereafter, the second passivation layer 1160 is patterned to form a passivation hole PH. The second passivation layer 1160 may include an inorganic material such as silicon oxide (SiOx) and/or silicon nitride (SiNx). In one embodiment, the second passivation layer 1160 includes silicon oxide (SiOx), and may have a thickness of about 500 Å. In another embodiment, the second passivation layer 1160 includes a plurality of layers including different materials from each other. The second passivation layer 1160 may cover an exposed portion of the drain electrode DE, an exposed portion of the first passivation layer 1120, an exposed portion of the organic layer 1130, and the common electrode CE.

The passivation hole PH may be formed by dry-etching. In one embodiment, the passivation hole PH is formed by dry-etching using a power having more than 7 kW and less than 13 kW. Preferably, the passivation hole PH may be formed by dry-etching using a power of 10 kW.

Figure 20:
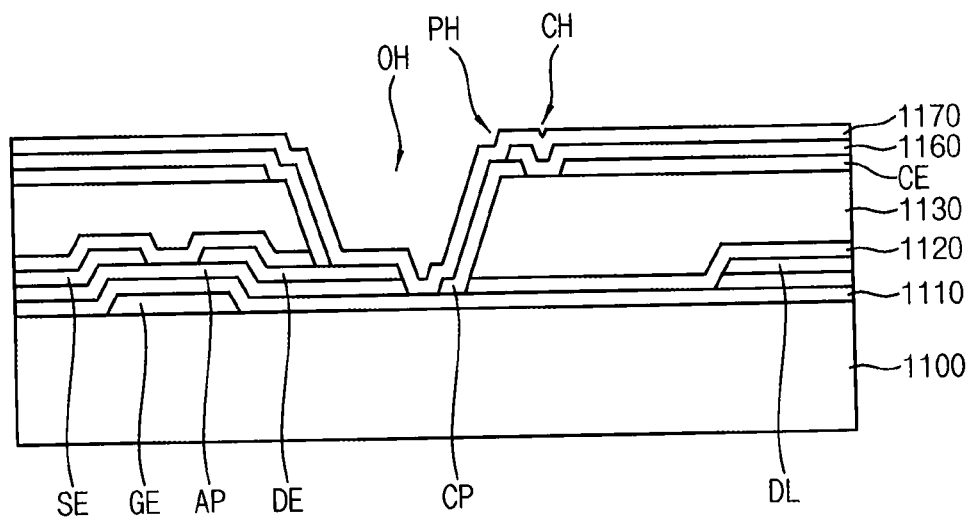

Referring to FIG. 20, a transparent electrode layer 1170 is formed on the base substrate 1100 on which the passivation hole PH is formed. The transparent electrode layer 1170 may include a transparent conductive material, such as indium tin oxide (ITO) and indium zinc oxide (IZO). In addition, transparent electrode layer 1170 may include titanium (Ti) and/or molybdenum titanium (MoTi).

Referring to FIG. 20, the transparent electrode layer 1170 is patterned to form a pixel electrode PE. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. An electric field applied between the pixel electrode PE and the common electrode CE changes the orientation of liquid crystal molecules to represent a gray scale.

Figure 21:
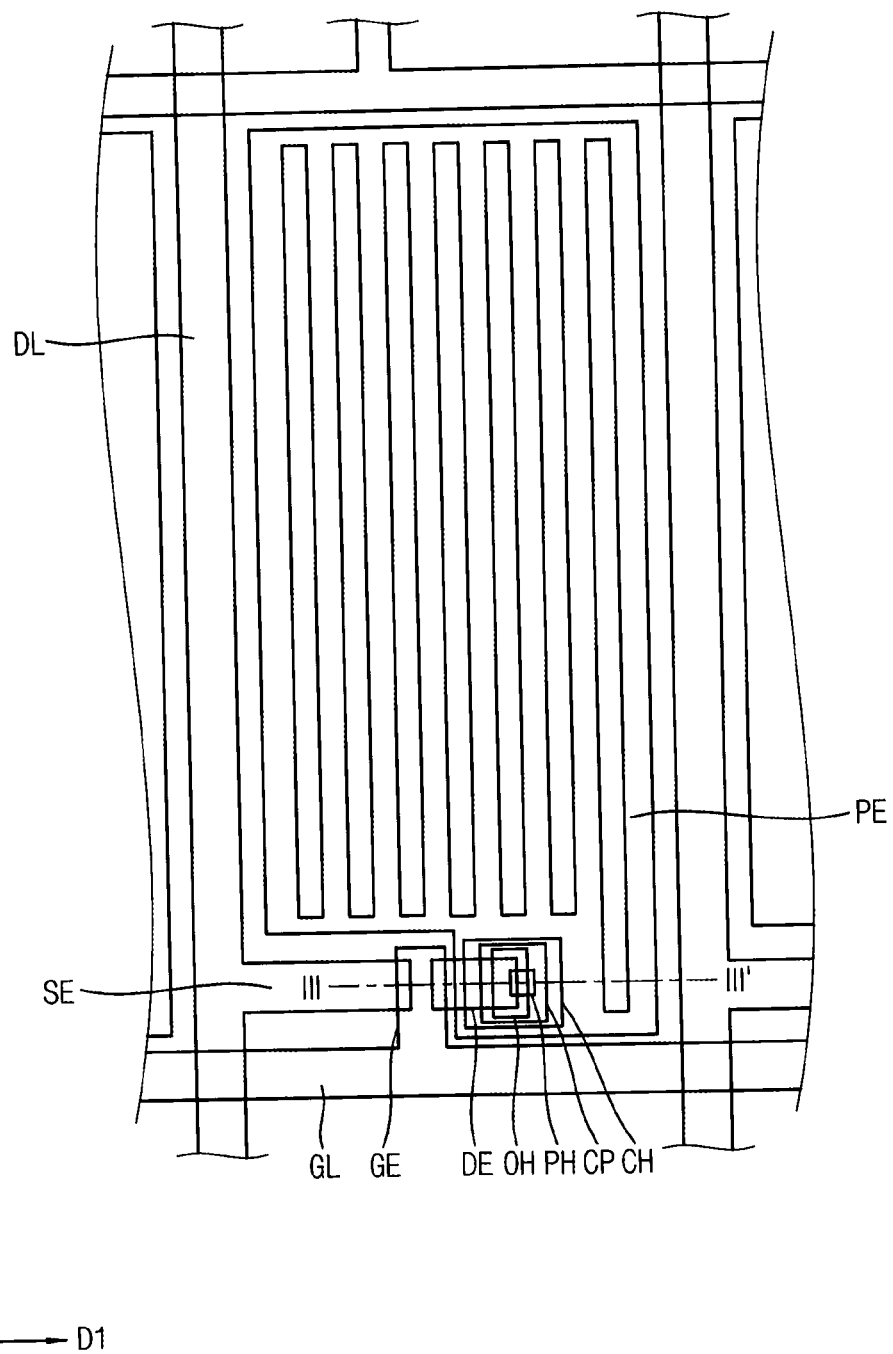
FIG. 21 is a plan view illustrating a thin film transistor substrate according to an exemplary embodiment of the present disclosure.
Figure 22:
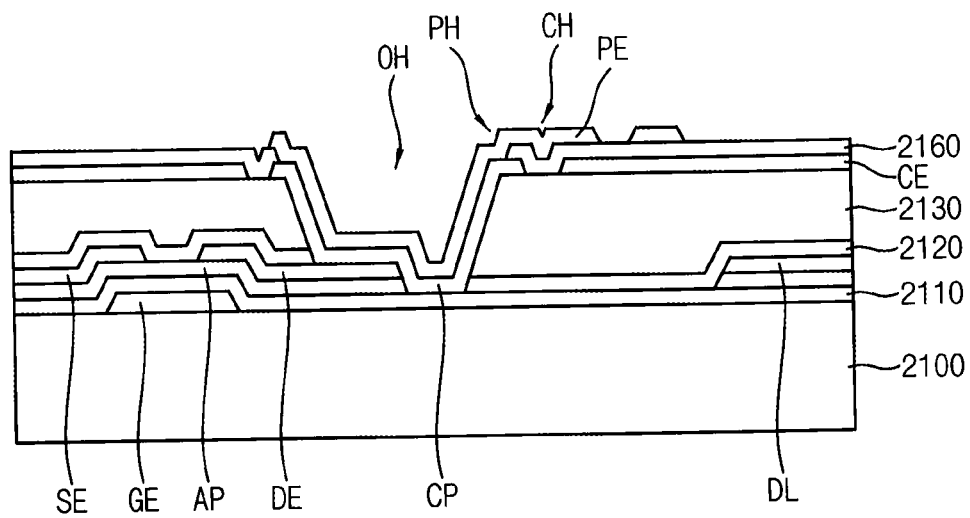
FIG. 22 is a cross-sectional view taken along the line III-III' of FIG. 21.

FIG. 21 is a plan view illustrating a thin film transistor substrate according to an exemplary embodiment. FIG. 22 is a cross-sectional view taken along the line III-III' of FIG. 21. Referring to FIGS. 21 and 22, a thin film transistor substrate 30 according to an exemplary embodiment includes a base substrate 2100, a gate metal pattern including a gate line GL and gate electrode GE, a data metal pattern including a data line, a gate insulation 2110, an active pattern AP, a first passivation layer 2120, an organic layer 2130, a common electrode CE, a second passivation layer 2160 and pixel electrode PE.

The gate line GL extends in a first direction D1. In one embodiment, the gate line GL has a single layer structure including copper (Cu), silver (Ag), chrome (Cr), molybdenum (Mo), aluminum (Al), titanium (Ti), manganese (Mn) and a mixture thereof. In another embodiment, the gate line GL has a multilayer structure having a plurality of layers including materials different each other. For example, the gate line GL may include a copper layer and a titanium layer disposed on and/or under the copper layer. The gate line GL is electrically connected to a gate electrode GE of a switching element. In addition, portions of the gate line GL may form the gate electrode GE.

The gate insulation layer 2110 is formed on the gate line GL and the gate electrode GE. The gate insulation layer 2110 may include an inorganic material such as silicon oxide (SiOx) and/or silicon nitride (SiNx). In one embodiment, the gate insulation layer 2110 includes silicon oxide (SiOx), and may have a thickness of about 500 Å. In another embodiment, the gate insulation layer 2110 includes a plurality of layers including different materials from each other.

The active pattern AP is formed on the gate insulation layer 2110. According to one embodiment, the active pattern AP includes a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+ a-Si:H).

The data metal pattern may be disposed on the active pattern AP. According to one embodiment, the data metal pattern may include the data line DL, the source electrode SE and the drain electrode DE. In one embodiment, the data metal pattern has a single layer structure including copper (Cu), silver (Ag), chrome (Cr), molybdenum (Mo), aluminum (Al), titanium (Ti), manganese (Mn) and a mixture thereof. In another embodiment, the data metal pattern has a multilayer structure having a plurality of layers including materials different each other.

The first passivation layer 2120 may be formed on the data metal pattern. The first passivation layer 2120 may include an inorganic material such as silicon oxide (SiOx) and/or silicon nitride (SiNx). For example, the first passivation layer 2120 includes silicon oxide (SiOx), and may have a thickness of about 500 Å. In addition, the first passivation layer 2120 may include a plurality of layers including different materials from each other.

The organic layer 2130 is disposed on the first passivation layer 2120. The organic layer 2130 planarizes an upper surface of the thin film transistor substrate 30 to prevent problems that may occur due to a step such as disconnection of a signal line. The organic layer 2130 may be an insulation layer including an organic material. For example, the organic layer 2130 may a color filter layer having a red color, a green color, a blue color or a white color.

The common electrode CE may be disposed on the organic layer 2130. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE.

A covering pattern CP is disposed on the organic layer 2130. The covering pattern CP covers an exposed surface of the organic layer 2130. The covering pattern CP may be disposed on the same layer as the common electrode CE. The covering pattern CP may include a transparent conductive material, such as indium tin oxide (ITO) and indium zinc oxide (IZO). In addition, the covering pattern CP may include titanium (Ti) and/or molybdenum titanium (MoTi).

The second passivation layer 2160 may be formed on the common electrode CE. The second passivation layer 2160 may include an inorganic material such as silicon oxide (SiOx) and/or silicon nitride (SiNx). In one embodiment, the second passivation layer 2160 includes silicon oxide (SiOx), and may have a thickness of about 500 Å. In another embodiment, the second passivation layer 2160 includes a plurality of layers including different materials from each other.

A common electrode hole CH may be formed through the common electrode CE. The common electrode hole CH partially exposes the drain electrode DE and the organic layer 2130. An organic hole OH may be formed through the organic layer 2130. The organic hole OH partially exposes the drain electrode DE. A passivation hole PH may be formed through the second passivation layer 2160. The passivation hole PH partially exposes the drain electrode DE and the organic layer 2130.

The covering pattern CP covers the organic layer 2130 and the drain electrode DE. The covering pattern CP is insulated from the common electrode CE and is electrically connected to the pixel electrode PE. The covering pattern CP is disposed in the common electrode hole CH to be overlapped with the organic hole OH and the passivation hole PH entirely.

The covering pattern CP covers an exposed surface of the organic layer 2130. Resultantly, $H_2O$ may not be absorbed to a surface of the organic layer 2130, preventing a formation of an active unfilled area (AUA).

The passivation hole PH may be formed by dry-etching. In one embodiment, the passivation hole PH may be formed by dry-etching using a power having more than 7 kW and less than 13 kW. Preferably, the passivation hole PH may be formed by dry-etching using a power of 10 kW.

When the second passivation layer 2160 is dry-etched, an exposed portion of the organic layer 2130 may be damaged.

However, the covering pattern CP covers an exposed surface of the organic layer 2130, preventing a damage to a surface of the organic layer 2130. Resultantly, H₂O may not be absorbed to a surface of the organic layer, preventing a formation of an active unfilled area (AUA).

A pixel electrode PE is formed on the second passivation layer 2160. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. Accordingly, an electric field applied between the pixel electrode PE and the common electrode CE changes the orientation of liquid crystal molecules to represent a gray scale.

Figure 23:
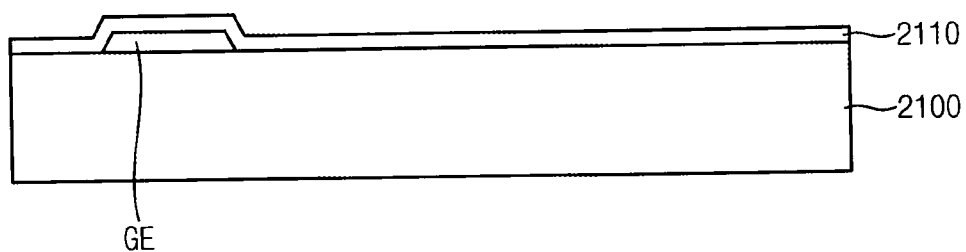
FIGS. 23 to 28 are cross-sectional views illustrating a method of manufacturing the thin film transistor of FIG. 22.

FIGS. 23 to 28 are cross-sectional views illustrating a method of manufacturing the thin film transistor of FIG. 22. Referring to FIG. 23, a gate electrode GE is formed on a base substrate 2100. For example, a gate metal layer is formed on the base substrate 2100, and patterned to form the gate line GL and the gate electrode GE. The gate metal pattern may include the gate line GL and the gate electrode. Examples of the base substrate 2100 may include a glass substrate, a quartz substrate, a silicon substrate, a plastic substrate and the like.

Thereafter, a gate insulation layer 2110 is formed to cover the gate line GL and the gate electrode GE. The gate insulation layer 2110 may include an inorganic insulation material. For example, the gate insulation layer 2110 includes silicon oxide (SiOx) or silicon nitride (SiNx). In one embodiment, the gate insulation layer 2110 includes silicon oxide (SiOx) and may have thickness of 500 Å. In another embodiment, the gate insulation layer 2110 has a multilayer structure having a plurality of layers including materials different each other.

Figure 24:
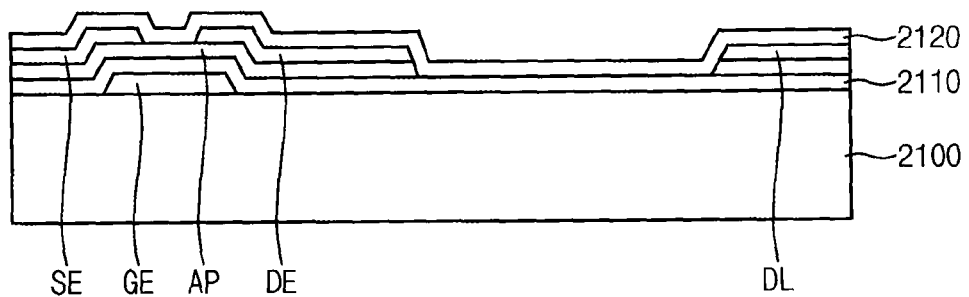

Referring to FIG. 24, an active pattern AP and a data metal pattern is formed on the gate insulation layer 2110. The data metal pattern may include a data line DL, a source electrode SE and a drain electrode DE. Thereafter, a first passivation layer 2120 may be formed on the base substrate 2100 on which the data metal pattern is formed.

The active pattern AP is formed on the gate insulation layer 2110. The active pattern AP may include a semiconductor pattern and an ohmic contact pattern. The ohmic contact pattern is formed on the semiconductor pattern. The semiconductor pattern may include a silicon semiconductor material. For example, the semiconductor pattern may include amorphous silicon (a-Si:H). The ohmic contact pattern may be interposed between the semiconductor pattern and a source electrode SE, and may be interposed between the semiconductor pattern and a drain electrode DE. The ohmic contact pattern may include n+ amorphous silicon (n+ a-Si:H).

The data metal pattern may be disposed on the active pattern AP. The data metal pattern may include the data line DL, the source electrode SE and the drain electrode DE. In one embodiment, the data metal pattern has a single layer structure including copper (Cu), silver (Ag), chrome (Cr), molybdenum (Mo), aluminum (Al), titanium (Ti), manganese (Mn) and a mixture thereof. In another embodiment, the data metal pattern has a multilayer structure having a plurality of layers including materials different each other.

The first passivation layer 2120 may be formed on the data metal pattern. The first passivation layer 2120 may include an inorganic material such as silicon oxide (SiOx) and/or silicon nitride (SiNx). In one embodiment, the first passivation layer 1120 includes silicon oxide (SiOx), and may have a thickness of about 500 Å. In another embodiment, the first passivation layer 2120 includes a plurality of layers including different materials from each other.

Figure 25:
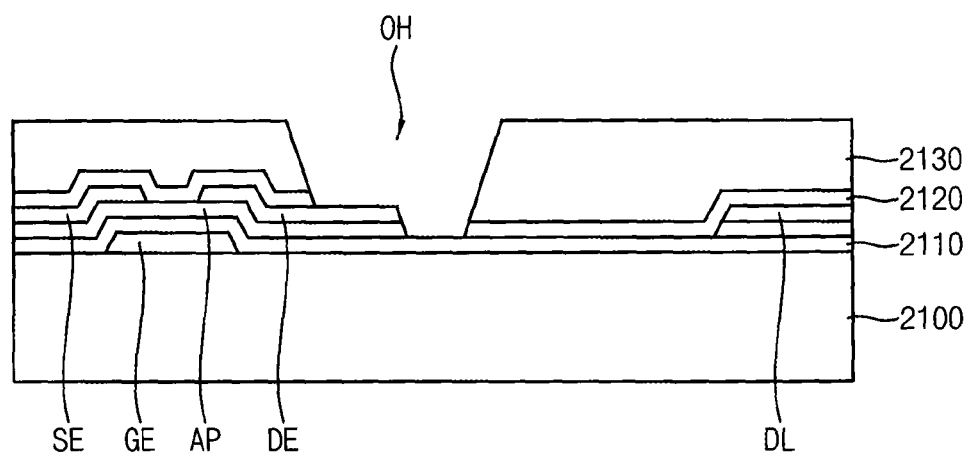

Referring to FIG. 25, an organic layer 2130 is formed on the first passivation layer 2120. Thereafter, the organic layer 2130 is patterned to form an organic hole OH. The organic layer 2130 is disposed on the first passivation layer 2120. The organic layer 2130 planarizes an upper surface of the thin film transistor 30 to prevent problems that may occur due to a step such as disconnection of a signal line. The organic layer 2130 may be an insulation layer including an organic material. For example, the organic layer 2130 may a color filter layer having a red color, a green color, a blue color or a white color. The organic hole OH partially exposes the drain electrode DE.

Figure 26:
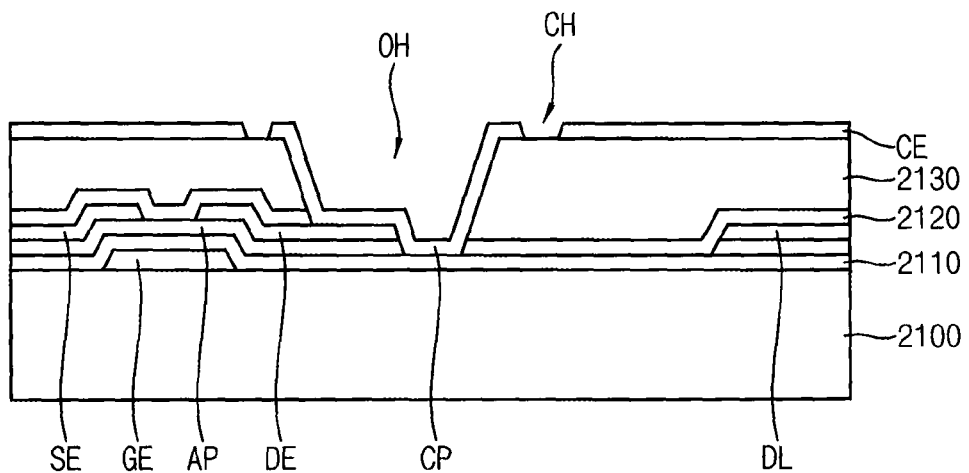

Referring to FIG. 26, a common electrode CE and a covering pattern CP are formed on the base substrate 2100 on which the organic hole OH is formed. The common electrode CE includes a common electrode hole CH. The common electrode hole CH is formed through the common electrode CE. The common electrode CE may include a transparent conductive material, such as indium tin oxide (ITO) and indium zinc oxide (IZO). In addition, the common electrode CE may include titanium (Ti) and/or molybdenum titanium (MoTi). A common voltage may be applied to the common electrode CE. A thickness of the common electrode CE may be less than 550 Å. The common electrode hole CH partially exposes the drain electrode DE and the organic layer 1130.

The covering pattern CP is disposed on the organic layer 1130 and covers an exposed portion of the organic layer 1130 and an exposed portion of the drain electrode DE. The covering pattern CP may be disposed on the same layer as the common electrode CE. The covering pattern CP may include a transparent conductive material, such as indium tin oxide (ITO) and indium zinc oxide (IZO). In addition, the covering pattern CP may include titanium (Ti) and/or molybdenum titanium (MoTi).

The covering pattern CP covers the organic layer 2130 and the drain electrode DE. The covering pattern CP is insulated from the common electrode CE and is electrically connected to the pixel electrode PE. The covering pattern CP is disposed in the common electrode hole CH to be overlapped with the organic hole OH and the passivation hole PH entirely.

The covering pattern CP covers an exposed portion of the organic layer 2130. Resultantly, H₂O may not be absorbed to a surface of the organic layer 2130, preventing a formation of an active unfilled area (AUA).

Figure 27:
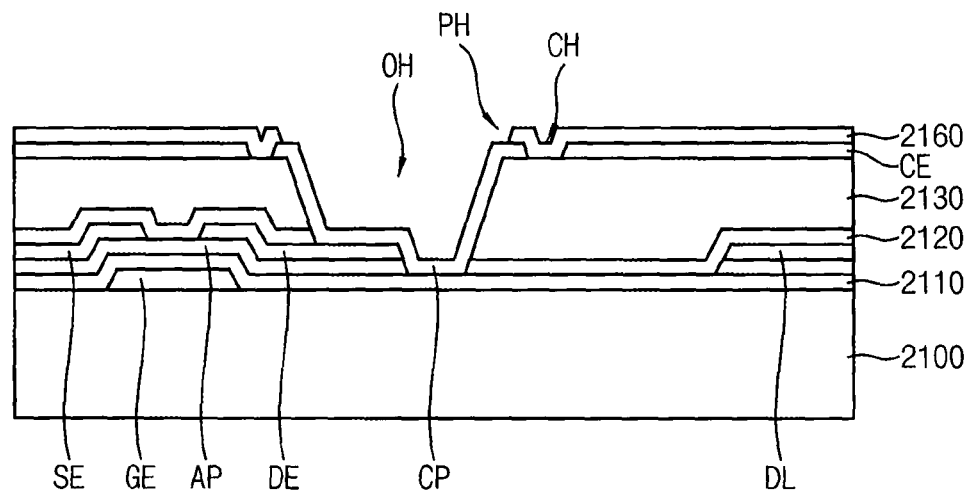

Referring to FIG. 27, a second passivation layer 2160 is formed on the base substrate 2100 on which the common electrode hole CH is formed. Thereafter, the second passivation layer 2160 is patterned to form a passivation hole PH. The second passivation layer 2160 may include an inorganic material such as silicon oxide (SiOx) and/or silicon nitride (SiNx). In one embodiment, the second passivation layer 2160 includes silicon oxide (SiOx), and may have a thickness of about 500 Å. In another embodiment, the second passivation layer 2160 includes a plurality of layers including different materials from each other. The second passivation layer 2160 may cover an exposed portion of the organic layer 2130 and the common electrode CE.

The passivation hole PH may be formed by dry-etching. In one embodiment, the passivation hole PH is formed by dry-etching using a power having more than 7 kW and less than 13 kW. Preferably, the passivation hole PH may be formed by dry-etching using a power of 10 kW.

Figure 28:
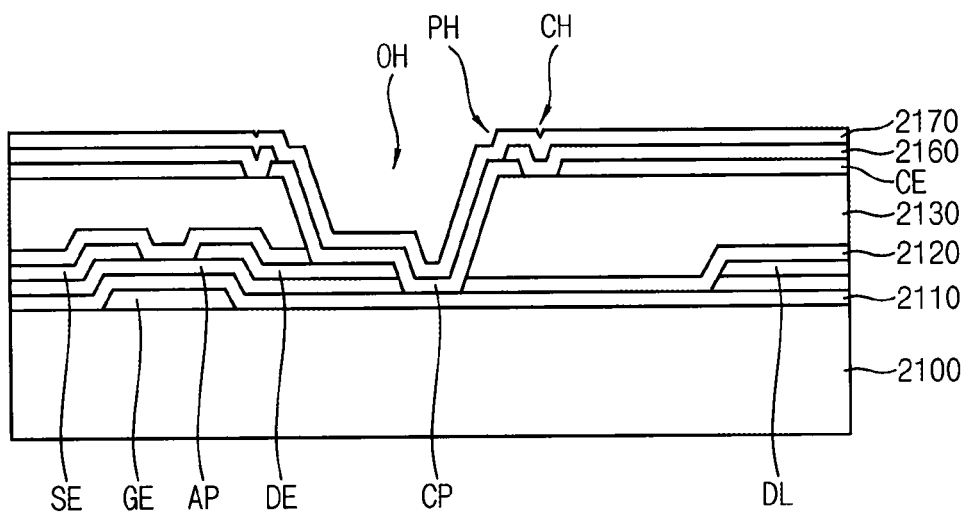

Referring to FIG. 28, a transparent electrode layer 2170 is formed on the base substrate 2100 on which the passivation hole PH is formed. The transparent electrode layer 2170 may include a transparent conductive material, such as indium tin oxide (ITO) and indium zinc oxide (IZO). In addition, transparent electrode layer 2170 may include titanium (Ti) and/or molybdenum titanium (MoTi).

Referring to FIG. 22, the transparent electrode layer 2170 is patterned to form a pixel electrode PE. The pixel electrode PE may include a transparent conductive material, such as indium tin oxide (ITO) and indium zinc oxide (IZO). In addition, the pixel electrode PE may include titanium (Ti) and/or molybdenum titanium (MoTi). The pixel electrode PE may have a slit shape. The pixel electrode PE overlaps with the common electrode CE. An electric field applied between the pixel electrode PE and the common electrode CE changes the orientation of liquid crystal molecules to represent a gray scale.

According to one embodiment, the passivation layer is formed by a relatively low power. Thus, a damage of a surface of the organic layer may be decreased preventing a formation of a bumpy structure on a surface of the organic layer. Resultantly, $H_2O$ may not be absorbed to a surface of the organic layer, preventing a formation of an active unfilled area (AUA).

According to one embodiment, a thickness of the pixel electrode PE is more than 750 Å and less than 1000 Å, and the pixel electrode PE covers an exposed portion of the organic layer 130 entirely. In addition, the covering pattern covers an exposed portion of the organic layer. Resultantly, $H_2O$ may not be absorbed to a surface of the organic layer, preventing a formation of an active unfilled area (AUA).

The foregoing is illustrative of the present disclosure and is not to be construed as limiting thereof. Although exemplary embodiments of the present disclosure have been described, those skilled in the art will readily appreciate that many modifications are possible in the exemplary embodiments without materially departing from the novel teachings and advantages of the present disclosure. Accordingly, all such modifications are intended to be included within the scope of the present disclosure. In the claims, means-plus-function clauses are intended to cover the structures described herein as performing the recited function and not only structural equivalents but also equivalent structures. Therefore, it is to be understood that the foregoing is illustrative of the present disclosure and is not to be construed as limited to the specific exemplary embodiments disclosed, and that modifications to the disclosed exemplary embodiments, as well as other exemplary embodiments, are intended to be included within the scope of the appended claims. A scope of the present disclosure may be determined by the following claims, with equivalents of the claims to be included therein.

What is claimed is:

1. A thin film transistor substrate comprising:
   a switching element comprising a gate electrode electrically connected to a gate line extending in a first direction, an active pattern overlapping with the gate electrode, a source electrode disposed on the active pattern and electrically connected to a data line extending in a second direction crossing the first direction, and a drain electrode spaced apart from the source electrode;
   an organic layer disposed on the switching element and having a substantially planar surface and an organic hole exposing an end portion of the drain electrode;
   a first electrode disposed directly on the substantially planar surface of the organic layer;
   a passivation layer disposed on the first electrode and having a passivation hole overlapping the organic hole, wherein the passivation layer exposes the end portion of the drain electrode and a lateral portion of the organic layer around the passivation hole; and
   a second electrode disposed on the passivation layer and directly covering the lateral portion of the organic layer that is exposed by the organic hole and the passivation hole of the passivation layer, and electrically connected to the drain electrode,
   wherein a thickness of the second electrode is thicker than a thickness of the first electrode.

2. The thin film transistor substrate of claim 1, wherein the passivation layer is disposed between the first electrode and the second electrode to insulate the first electrode and the second electrode.

3. The thin film transistor substrate of claim 2, wherein the passivation hole is larger than the organic hole.

4. The thin film transistor substrate of claim 1, wherein a surface of the organic layer has a bumpy structure and an average height of bumps of the surface of the organic layer is less than 300 Å.

5. The thin film transistor substrate of claim 1, wherein the second electrode comprises a transparent conductive material.

6. The thin film transistor substrate of claim 5, wherein a thickness of the second electrode is more than 750 Å and less than 1000 Å.

7. A thin film transistor substrate comprising:
   a switching element comprising a gate electrode electrically connected to a gate line extending in a first direction, an active pattern overlapping with the gate electrode, a source electrode disposed on the active pattern and electrically connected to a data line extending in a second direction crossing the first direction, and a drain electrode spaced apart from the source electrode;
   an organic layer disposed on the switching element having an organic hole exposing an end portion of the drain electrode;
   a first electrode directly disposed on the organic layer;
   a passivation layer disposed on the first electrode having a passivation hole overlapping the organic hole, wherein the passivation layer exposes the end portion of the drain electrode and a lateral portion of the organic layer, and, the passivation hole is larger than the organic hole;
   a second electrode disposed on the passivation layer and covering underlying layers exposed by the organic hole and the passivation hole of the passivation layer, wherein the passivation layer insulates the first electrode and the second electrode, and the second electrode is electrically connected to the drain electrode; and
   a covering pattern disposed in the passivation hole to cover the lateral portion of the organic layer that is exposed by the passivation hole of the passivation layer,
   wherein the second electrode entirely covers the covering pattern disposed in the passivation hole, and
   wherein the covering pattern comprises a transparent conductive material.

8. The thin film transistor substrate of claim 7, wherein the covering pattern covers an exposed portion of the organic layer including the lateral portion of the organic layer and an exposed portion of the drain electrode.

9. The thin film transistor substrate of claim 8, wherein the covering pattern is disposed on the same layer as the first electrode.

10. The thin film transistor substrate of claim 8, wherein the covering pattern is insulated from the first electrode and electrically connected to the second electrode.

11. The thin film transistor substrate of claim 7, wherein the first electrode and the second electrode comprise a transparent conductive material.

12. The thin film transistor substrate of claim 7, wherein a surface of the organic layer has a bumpy structure and an average height of bumps of the surface of the organic layer is less than 300 Å.

13. A method manufacturing a thin film transistor substrate, the method comprising:
forming a gate metal pattern on a base substrate, the gate metal pattern comprising a gate line extending in a first direction and a gate electrode electrically connected to the gate line;
forming an active pattern overlapping with the gate electrode;
forming a data metal pattern on the active pattern, the data metal pattern comprising a data line extending in a second direction crossing the first direction, a source electrode electrically connected with the gate line and a drain electrode spaced apart from the source electrode;
forming an organic layer on the date metal pattern, wherein the organic layer has an organic hole exposing an end portion of the drain electrode;
forming a first electrode directly on the organic layer;
forming a passivation layer on the first electrode, wherein the passivation layer has a passivation hole overlapping the organic hole, wherein the passivation hole is larger than the organic hole, and the passivation layer exposes the end portion of the drain electrode and a lateral portion of the organic layer;
etching the passivation layer by using a power having more than 7 kW and less than 13 kW to form the passivation hole exposing a portion of the drain electrode and a portion of the organic layer;
forming a second electrode on the passivation layer by covering the lateral portion of the organic layer that is exposed by the organic hole and the passivation hole of the passivation layer, wherein the second electrode is electrically connected to the drain electrode; and
forming a covering pattern in the passivation hole to cover the lateral portion of the organic layer that is exposed by the passivation hole of the passivation layer,
wherein the second electrode entirely covers the covering pattern disposed in the passivation hole, and
wherein the covering pattern comprises a transparent conductive material.

14. The method of claim 13, wherein a thickness of the second electrode is thicker than a thickness of the first electrode.

15. The method of claim 14, wherein a thickness of the second electrode is more than 750 Å and less than 1000 Å.

16. The method of claim 13, wherein the covering pattern is disposed on the same layer as the first electrode.

17. The method of claim 16, wherein the covering pattern covers an exposed portion of the organic layer including the lateral portion of the organic layer.

18. The method of claim 16, wherein the covering pattern covers an exposed portion of the organic layer including the lateral portion of the organic layer and an exposed portion of the drain electrode.

19. The method of claim 16, wherein the covering pattern is insulated from the first electrode and electrically connected to the second electrode.

20. The method of claim 16, wherein the first electrode and the second electrode comprise a transparent conductive material.

21. A thin film transistor substrate comprising:
a switching element comprising a gate electrode electrically connected to a gate line, an active pattern overlapping with the gate electrode, a source electrode disposed on the active pattern and electrically connected to a data line, and a drain electrode spaced apart from the source electrode;
an organic layer disposed on the switching element and having an organic hole exposing an end portion of the drain electrode;
a first electrode disposed on the organic layer and having an electrode hole overlapping the organic hole and exposing a lateral portion of the organic layer and the end portion of the drain electrode;
a passivation layer disposed on the first electrode and having a passivation hole overlapping the organic hole, wherein the passivation layer exposes the lateral portion of the organic layer and the end portion of the drain electrode, wherein the passivation hole is larger than the organic hole; and
a second electrode directly covering the lateral portion of the organic layer that is exposed by the organic hole and the passivation hole of the passivation layer and covering the end portion of the drain electrode and the lateral portion of the organic layer, wherein the second electrode is connected to the drain electrode,
wherein a thickness of the second electrode is thicker than a thickness of the first electrode.

* * * * *